(12) United States Patent  (10) Patent No.: US 6,643,411 B2
Nonaka  (45) Date of Patent: Nov. 4, 2003

(54) APPARATUS AND METHOD OF OBTAINING A RADIATION IMAGE OF AN OBJECT

(75) Inventor: Hideki Nonaka, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/259,621

(22) Filed: Sep. 30, 2002

(65) Prior Publication Data

US 2003/0081823 A1 May 1, 2003

Related U.S. Application Data

(62) Division of application No. 09/193,874, filed on Nov. 18, 1998, now Pat. No. 6,516,098.

(30) Foreign Application Priority Data

Nov. 20, 1997 (JP) .............................................. 9-319866

(51) Int. Cl.[7] .............................................. G06K 9/00
(52) U.S. Cl. ..................... 382/274; 378/96; 378/98.7
(58) Field of Search .................................. 382/132, 274; 378/96, 97, 98.7, 98.8; 250/370.07, 370.09

(56) References Cited

U.S. PATENT DOCUMENTS

| | | | |
|---|---|---|---|
| 4,810,881 A | 3/1989 | Berger et al. | 250/370.01 |
| 4,851,678 A | 7/1989 | Adachi et al. | 250/327.2 |
| 5,132,539 A | 7/1992 | Kwasnick et al. | 250/361 R |
| 5,381,014 A | 1/1995 | Jeromin et al. | 250/370.09 |
| 5,396,072 A | 3/1995 | Schiebel et al. | 250/370.09 |
| 5,418,377 A | 5/1995 | Tran et al. | 250/483.1 |
| 5,444,756 A | 8/1995 | Pai et al. | 378/98.8 |
| 5,894,129 A | 4/1999 | Pool | 250/370.09 |
| 5,946,407 A | 8/1999 | Bamberger et al. | 382/132 |
| 5,974,166 A | 10/1999 | Ino et al. | 382/132 |

Primary Examiner—Andrew W. Johns
(74) Attorney, Agent, or Firm—Fitzpatrick, Cella, Harper & Scinto (57) ABSTRACT

An apparatus for obtaining a radiation image of an object includes a radiation image sensing unit having a plurality of photoelectric conversion elements two-dimensionally arranged in a matrix manner, and a sensor for detecting irradiation of radiation. The apparatus also includes a determining system for determining an irradiation state of radiation on the basis of an output from the sensor, and a controlling system for controlling both a start and an end of an image sensing state of the radiation image sensing unit on the basis of the determination by the determining step.

6 Claims, 10 Drawing Sheets

APPARATUS AND METHOD OF OBTAINING A RADIATION IMAGE OF AN OBJECT

This application is a division of application Ser. No. 09/193,874, filed Nov. 18, 1998 now U.S. Pat. No. 6,516,098.

BACKGROUND OF THE INVENTION

1. Field of the Invention

The present invention relates to an apparatus and method of obtaining an intensity distribution of radiation transmitted through an object, i.e., a radiation image of an object.

2. Description of the Related Art

Image sensing methods of irradiating an object with radiation and detecting the intensity distribution of radiation transmitted through the object to obtain a radiation image of the object are generally extensively used in industrial nondestructive inspection and medical diagnoses. Of practical image sensing methods of obtaining a radiation image of an object, the most general approach is to combine a so-called "fluorescent screen" (or intensifying screen) which emits fluorescence when irradiated with radiation with a silver halide film. In this method, the fluorescent screen is irradiated with radiation via an object. The fluorescent screen converts the radiation into visible light and the light forms a latent image on the silver halide film. This silver halide film is chemically treated to obtain a visible image. Radiation images obtained by this image sensing method are so-called analog photographs and used in medical diagnoses, nondestructive inspection, and the like.

Also, a computed radiography apparatus (to be referred to as a CR apparatus hereinafter) using an imaging plate (to be referred to as an IP hereinafter) coated with a stimulative phosphor is beginning to be used. When the IP primarily excited by radiation is secondarily excited by light such as an infrared laser beam, the IP emits light called stimulative fluorescence. The CR apparatus obtains image data of a radiation image by detecting this stimulative fluorescence by using a photosensor such as a photomultiplier. On the basis of this image data, the CR apparatus forms a visible light image on, e.g., a photosensitive material or a CRT. Although this CR apparatus is a digital apparatus, the CR apparatus is an indirect digital radiation image sensing apparatus because an image formation process, i.e., reading by secondary excitation is necessary. The reason why the apparatus is called "indirect" is that it cannot instantly display sensed radiation images like in analog technologies.

On the other hand, a technology is recently developed by which digital images are obtained by using a photoelectric converter in which light-receiving elements such as fine photoelectric converting elements and switching elements are arranged in a matrix manner. Radiation image sensing apparatuses in which a phosphor is stacked on an CCD or an amorphous silicon two-dimensional image sensing element are disclosed in U.S. Pat. Nos. 5,418,377, 5,396,072, 5,381,014, 5,132,539, and 4,810,881. These radiation image sensing apparatuses can instantly display obtained radiation images and hence can be called direct digital radiation image sensing apparatuses.

The digital radiation image sensing apparatuses have the following advantages over the analog photographing technologies. That is, no film is necessary, and obtained information can be enlarged by image processing and used in the form of a database. Also, the advantage that the direct digital image sensing apparatuses have over the indirect digital radiation image sensing apparatuses is instantaneity. The ability to display sensed radiation images on the spot is particularly useful on urgent medical scenes.

Unfortunately, a two-dimensional solid-state image sensor has a dark current which is one cause of noise, so the image sensing time of the radiation image sensing apparatus cannot be indiscriminately increased. Therefore, a radiation image is obtained by exchanging signals with a radiation generator and synchronizing the irradiation timing with the image sensing timing of the radiation image sensing apparatus following one of image sensing procedures below.

(1) Upon receiving an image sensing request signal from the radiation generator, the radiation image sensing apparatus initializes the apparatus. When the initialization is complete, the radiation image sensing apparatus sends an image sensing preparation completion signal to the radiation generator. When a preset irradiation time has elapsed, the radiation generator terminates the irradiation and sends an irradiation end signal co the radiation image sensing apparatus. Upon receiving the irradiation end signal, the radiation image sensing apparatus terminates accumulation of output from the photoelectric converting elements and switches the operation mode to an image data output operation.

(2) If no irradiation end signal can be obtained because of the type of interface, the radiation image sensing apparatus measures the time. When almost the same time as the irradiation time set in the radiation generator has elapsed, the radiation image sensing apparatus terminates accumulation of the outputs from photoelectric converting elements and starts the image data output operation.

In image sensing procedure (1) in which the radiation generator controls the radiation image sensing apparatus, the interface between the two apparatuses is complicated. Also, the radiation generator and the radiation image sensing apparatus are enlarged and complicated because these apparatuses must be constructed as one system. This makes this radiation image sensing apparatus difficult to be used as an on-vehicle radiation image sensing apparatus used in group examination or a portable radiation image sensing apparatus for sensing radiation images on the bed side.

In image sensing procedure (2), the radiation image sensing apparatus cannot check the end of irradiation, so it cannot be ensured that their radiation is really complete. The radiation image sensing apparatus can also be previously given an accumulation time for accumulating output from the photoelectric converting elements so as to be capable of compensating for variations in the irradiation time in the radiation generator. However, it is still necessary to measure the individual characteristics of the radiation generator and calibrate the radiation image sensing apparatus when these apparatuses are installed. Additionally, since unnecessary output from the photoelectric converting elements is accumulated, extra noise components are added to obtained image data by a dark current. Furthermore, the irradiation time must be previously acquired from the radiation generator or a control terminal of the radiation image sensing apparatus. This complicates the interface with the radiation generator or makes the operation cumbersome.

SUMMARY OF THE INVENTION

It is an object of the present invention to provide a radiation image sensing apparatus and method capable of sensing a radiation image with a simple interface.

It is another object of the present invention to provide a radiation image sensing apparatus and method which obviate the need to measure the individual characteristics of a radiation generator and calibrate the radiation image sensing apparatus when these apparatuses are installed.

To achieve the above objects, one preferred embodiment of the present invention discloses a radiation image sensing apparatus for irradiating an object with radiation to obtain a radiation image, comprising a radiation image sensing unit having a plurality of photoelectric converting elements two-dimensionally arranged in a matrix manner; a sensor for detecting irradiation of radiation; determining means for determining an irradiation state of radiation on the basis of an output from the sensor; and control means for controlling a state of the radiation image sensing unit on the basis of the determination by the determining means.

Another preferred embodiment of the present invention discloses a radiation image sensing apparatus for irradiating an object with radiation to obtain a radiation image, comprising: radiation control means for controlling irradiation of radiation; a radiation image sensing unit having a plurality of photoelectric converting elements two-dimensionally arranged in a matrix manner; a sensor for detecting irradiation of radiation; determining means for determining an irradiation state of radiation on the basis of an output from the sensor; and image sensing control means for setting a state of the radiation image sensing unit, wherein upon receiving a signal indicating a start of image sensing, the radiation control means outputs an image sensing request signal; the image sensing control means having received the image sensing request signal sets the radiation image sensing unit in an image sensing preparation state, and outputs an image sensing preparation completion signal; the radiation control means starts irradiation of radiation when receiving the image sensing preparation completion signal, and terminates the irradiation of radiation when an accumulated irradiation amount reaches a predetermined value or a preset time elapses; the determining means outputs an irradiation start signal indicating a start of irradiation of radiation when an output from the sensor exceeds a predetermined level, and outputs an irradiation end signal indicating an end of the irradiation of radiation when the output from the sensor becomes smaller than a predetermined level; and the image sensing control means switches the radiation image sensing unit from the image sensing preparation state to an image sensing state when receiving the irradiation start signal, and switches the radiation image sensing unit from the image sensing state to an image sensing result output enable state when receiving the irradiation end signal.

Still another preferred embodiment of the present invention discloses a radiation image sensing apparatus for irradiating an object with radiation to obtain a radiation image, comprising: radiation control means for controlling irradiation of radiation; a radiation image sensing unit having a plurality of photoelectric converting elements two-dimensionally arranged in a matrix manner; a sensor for detecting irradiation of radiation; determining means for determining an irradiation state of radiation on the basis of an output from the sensor; and image sensing control means for setting a state of the radiation image sensing unit, wherein the radiation image sensing unit is switched to an image sensing preparation state when a power supply of the apparatus is turned on or an image sensing result is output; radiation is irradiated, when a signal indicating image sensing start is input, until an accumulated irradiation amount reaches a predetermined value or a preset time elapses; the radiation image sensing unit is switched from the image sensing preparation state to an image sensing state when an output from the sensor exceeds a predetermined level; and the radiation image sensing unit is switched from the image sensing state to an image sensing result output enable state when the output from the sensor becomes smaller than a predetermined level.

It is still another object of the present invention to provide a radiation image sensing apparatus and method which reduce the influence of noise produced by a dark current in a photoelectric converting element.

To achieve the above-object, still another preferred embodiment of the present invention discloses a radiation image sensing apparatus for irradiating an object with radiation to obtain a radiation image, comprising: a radiation image sensing unit having a plurality of photoelectric converting elements two-dimensionally arranged in a matrix manner; a sensor for detecting irradiation of radiation; determining means for determining an irradiation state of radiation on the basis of an output from the sensor; and control means for controlling a state of the radiation image sensing unit on the basis of the determination by the determining means wherein the image sensing preparation state comprises refreshing of the photoelectric converting elements and a signal output state which reduces an influence of a dark current flowing through the photoelectric converting elements on an image sensing result.

Other features and advantages of the present invention will be apparent from the following description taken in conjunction with the accompanying drawings, in which like reference characters designate the same or similar parts throughout the figures thereof.

DETAILED DESCRIPTION OF THE PREFERRED EMBODIMENTS

Preferred embodiments of a radiation image sensing apparatus and image sensing method according to the present invention will be described in detail below with reference to the accompanying drawings.

First Embodiment

Outline of Arrangement

Figure 1:
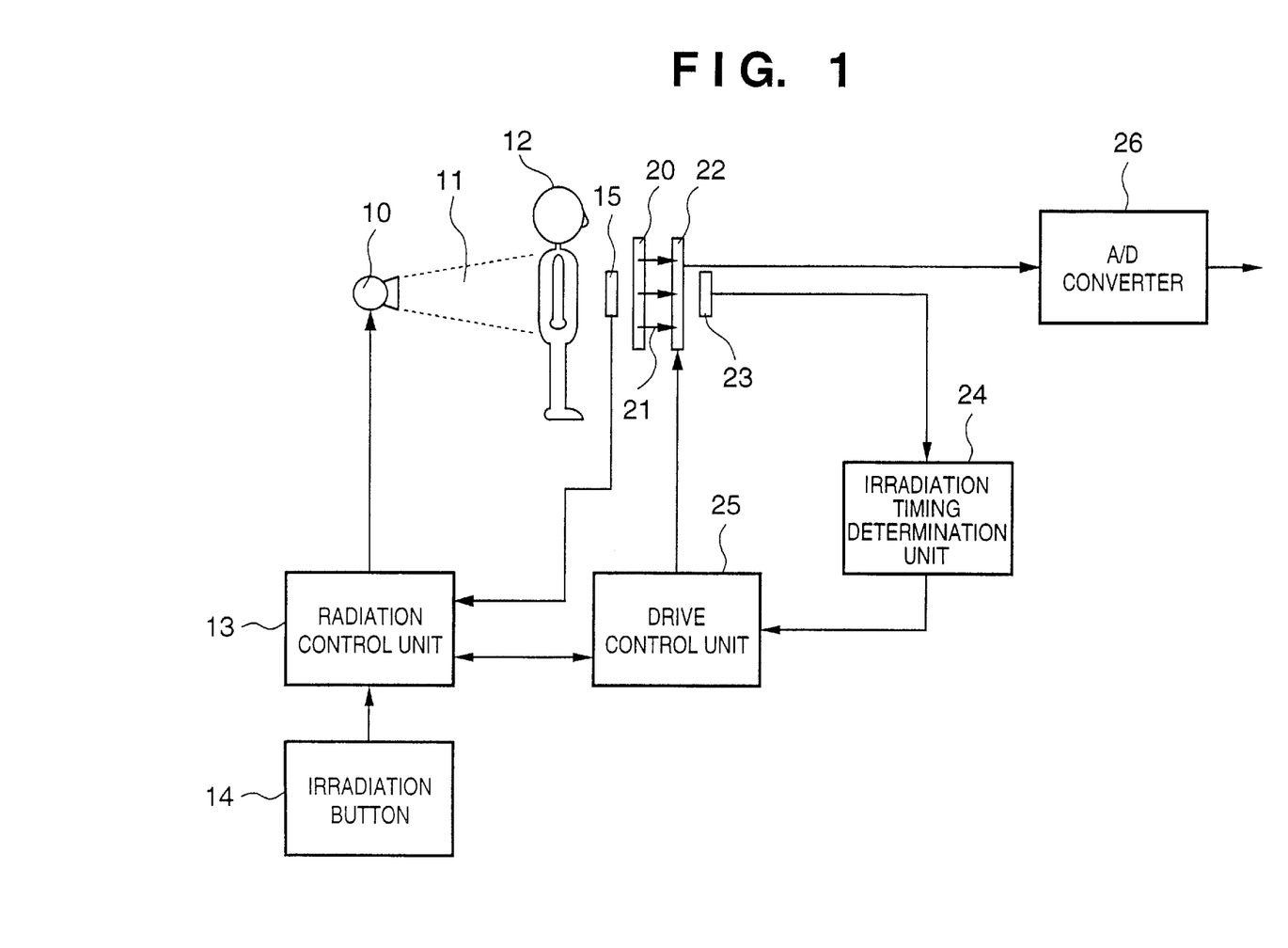
FIG. 1 is a block diagram showing an outline of the arrangement of a radiation image sensing apparatus according to the first embodiment of the present invention.

FIG. 1 is a block diagram showing an outline of the arrangement of a radiation image sensing apparatus according to the first embodiment.

In FIG. 1, reference numeral 10 denotes a radiation source capable of emitting pulse radiation 11. A radiation control unit 13 controls ON/OFF of the radiation pulses and the tube voltage and tube current of an internal radiation tube of the radiation source 10. The radiation 11 emitted by the radiation source 10 transmits through an object 12 as a patient to be diagnosed and is incident on a phosphor which converts the radiation 11 into visible light. The radiation 11 transmitted through the object 12 changes its transmission amount in accordance with the size and shape of bone or viscera and the presence/absence of a morbid portion in the object 12 and hence contains corresponding pieces of image information. The radiation 11 transmitted through the object 12 is converted into visible light by the phosphor 20 and incident on a radiation image sensing unit 22 as image information light 21.

The radiation image sensing unit 22 of this embodiment includes a plurality of photoelectric converting elements arranged in a matrix manner, converts the image information light 21 into an electrical signal, and stores the electrical signal. The electrical signal obtained by the radiation image sensing unit 22 is converted into a digital image signal by an analog-to-digital (A/D) converter 26. A drive control unit 25 controls the image sensing time, driving method, and the like of the radiation image sensing unit 22. Also, to synchronize the start of irradiation with the start of an image sensing operation of the radiation image sensing unit 22, the radiation control unit 13 and the drive control unit 25 are connected by a synchronizing signal line.

Figure 2:
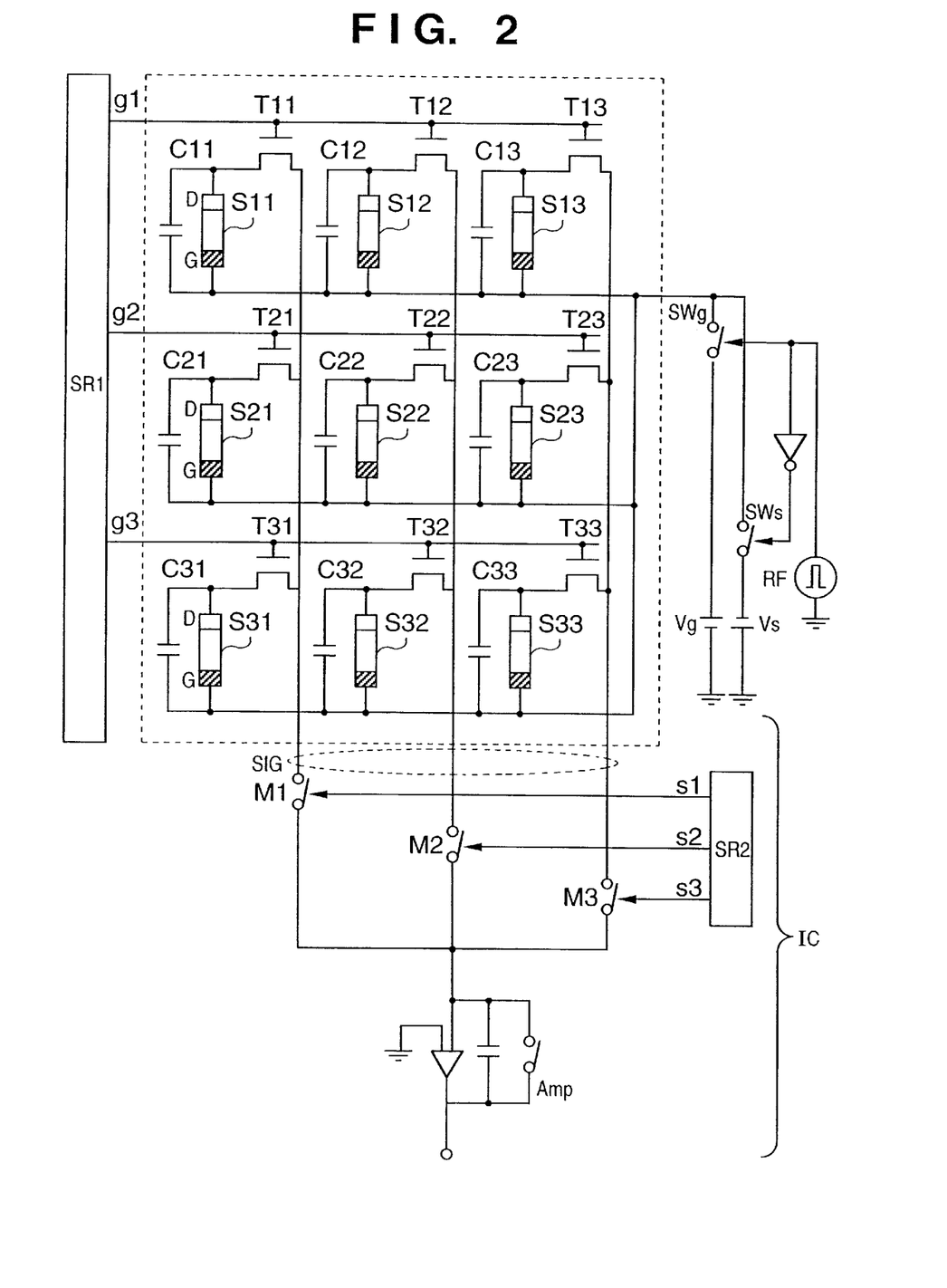
FIG. 2 is a circuit diagram showing the arrangement of a radiation image sensing unit.

FIG. 2 is a circuit diagram showing the configuration of the radiation image sensing unit 22. In FIG. 2, reference symbols S11 to S33 denote photoelectric converting elements each having a lower electrode or G electrode and an upper electrode or D electrode; C11 to C33, storage capacitors; T11 to T33, transfer TFTs (Thin Film Transistors); Vs, a data read power supply; and Vg, a refresh power supply. These power supplies Vs and Vg are connected to the G electrodes of the photoelectric converting elements S11 to S33 via switches SWs and SWg, respectively. The switches SWs and SWg are connected via an inverter and directly, respectively, to a refresh controller RF as a part of the drive control unit 25. The switch SWg is ON during a refresh period, and the switch SWs is ON during other periods. One pixel of the radiation image sensing unit 22 is composed of one photoelectric converting element, a capacitor, and a TFT. An output signal from a pixel is connected to a detecting integrated circuit IC through a signal line SIG. For the sake of simplicity of explanation, the radiation image sensing unit 22 shown in FIG. 2 is a two-dimensional area sensor in which three horizontal blocks each containing three pixels are vertically arranged, i.e., which includes a total of nine pixels. However, an actual two-dimensional area sensor must include more elements in both the vertical and horizontal directions. These nine pixels are divided into three blocks, and output signals from three pixels in each block are simultaneously transferred through the signal lines SIG. The detecting integrated circuit IC sequentially outputs these signals in units of pixels.

Photoelectric Converting Element

Figure 3A:
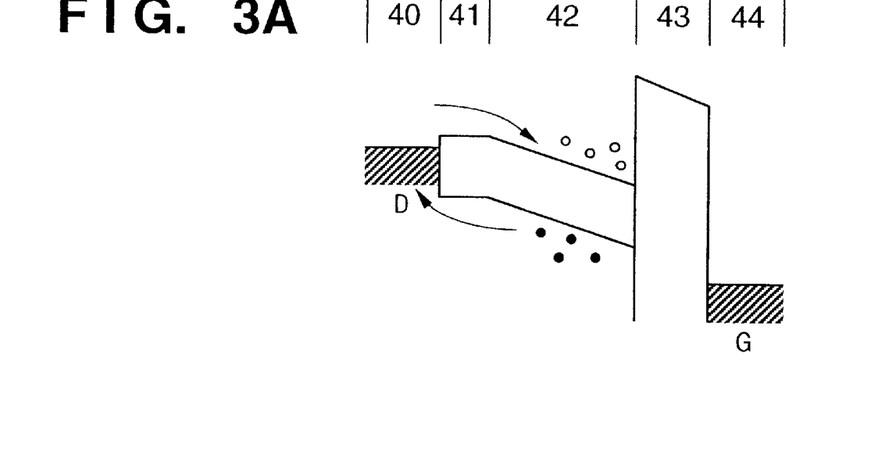
FIGS. 3A to 3C are views showing energy bands in different operations of a photoelectric converting element.
Figure 3B:
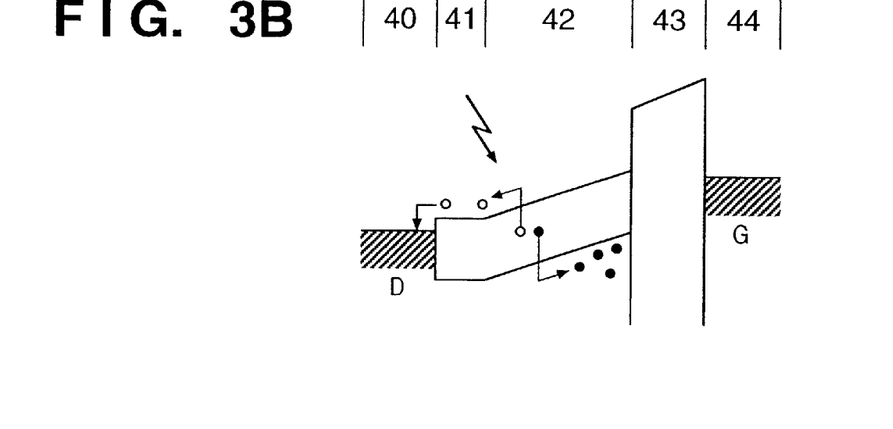
Figure 3C:
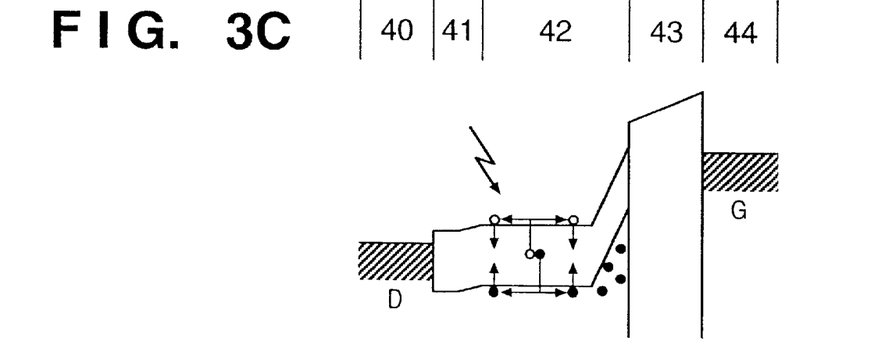

Operations of the photoelectric converting elements S11 to S33 used in this embodiment will be described below. FIGS. 3A to 3C are photoelectric converting element energy band diagrams showing refreshing and photoelectric conversion in this embodiment. Reference numeral 44 denotes a lower electrode (G electrode) made of chromium (Cr); 43, a silicon nitride (SiN) insulating layer for inhibiting passing of electron-hole copolymerization; 42, a photoelectric converting semiconductor layer (to be also referred to as an i layer hereinafter) made of an intrinsic semiconductor i layer of amorphous silicon hydroxide (α-Si); 41, an α-Si n injection inhibiting layer (to be also referred to as an n layer hereinafter) for inhibiting injection of holes into the photoelectric converting semiconductor layer 42; and 40, an upper electrode (D electrode) made of aluminum (Al).

This photoelectric converting element performs two operations, i.e., refreshing and photoelectric conversion, in accordance with the ways voltages are applied to the D electrode 40 and the G electrode 44. Referring to FIG. 3A showing refreshing, a potential negative with respect to the G electrode 44 is applied to the D electrode 40. Consequently, holes indicated by black circles in the i layer 42 are guided to the D electrode 40 by the electric field. Simultaneously, electrons indicated by white circles are injected into the i layer 42 from the D electrode 40. Some holes and electrons recombine and disappear in the n layer 41 and the i layer 42. If the D electrode 40 is kept at the negative potential with respect to the G electrode 44 for a sufficiently long time, the holes in the i layer 42 are swept away from the i layer 42.

To change the mode to photoelectric conversion shown in FIG. 3B, a potential positive with respect to the G electrode 44 is applied to the D electrode 40. Consequently, the electrons in the i layer 42 are guided to the D electrode 40. However, no holes are guided from the D electrode 40 to the i layer 42 because then layer 41 functions as an injection inhibiting layer. If light enters the i layer 42 in this state, the light is absorbed by the i layer 42 to emit electron-hole pairs. The electrons are guided to the D electrode 40 by the electric field. The holes move through the i layer 42 and reach the interface between the i layer 42 and the insulating layer 43. However, the holes cannot move to the insulating layer 43, so they stay in the i layer 42. Since the electrons move to the D electrode 40 and the holes move to the interface between the i layer 42 and the insulating layer 43, a current flows out from the G electrode 44 in order to maintain electrical neutrality in the photoelectric converting element. The value of this current is in proportion to the incoming light because the value corresponds to the electron-hole pairs generated by the light. When refreshing is again performed after photoelectric conversion is performed for a certain period, the holes staying in the i layer 42 are guided to the D electrode 40 as described above, and a current corresponding to this hole movement flows through the photoelectric converting element. The number of holes stored in the i layer 42 corresponds to the total amount of light incident during the photoelectric conversion period.

If, however, the photoelectric conversion period extends for some reason or the intensity of incoming light is high, no current flows through the photoelectric converting element in some cases although light enters the element. This is because a large number of holes stay in the i layer 42 as shown in FIG. 3C and decrease the inclination of electric field between the D electrode 40 and the i layer 42, so the generated electrons are no longer guided to the D electrode 40 to recombine with the holes in the i layer 42. If the light incident state changes in this state, a current sometimes unstably flows through the photoelectric converting element. However, when refreshing is again executed, the holes in the i layer 42 are swept away, and a current proportional to the incoming light is again obtained in the next photoelectric conversion.

When holes in the i layer 42 are to be swept away during refreshing, it is idealistic to sweep away all holes. However, a current equal to incident light can be obtained even when only some holes are swept away. That is, it is only necessary to avoid the state shown in FIG. 3C during photoelectric conversion. The potential of the D electrode 40 with respect to the G electrode 44 during refreshing, the refreshing period, and the characteristics of the n layer 41 (injection inhibiting layer) need only be so determined as to prevent the state shown in FIG. 3C during photoelectric conversion. Also, during refreshing, it is not always necessary to inject electrons into the i layer 42 and the potential of the D electrode 40 with respect to the G electrode is not limited to a negative potential. That is, when a large number of holes stay in the i layer 42, the electric field in the i layer 42 guides the holes toward the D electrode 40 even if the potential of the D electrode 40 with respect to the D electrode 44 is a positive potential. Similarly, it is not always necessary for the n layer 41 (injection inhibiting layer) to be able to inject electrons into the i layer 41.

Photoelectric conversion herein described equals an operation of sensing a radiation image of an object in this embodiment and hence will also be referred to as an "image sensing operation" hereinafter.

Operations of Radiation Image Sensing Unit

Operations of the radiation image sensing unit 22 will be described next. In refreshing, shift registers SR1 and SR2 apply Hi-level signals to control lines g1 to g3 and s1 to s3, respectively. Consequently, the transfer TFTs T11 to T33 and switches M1 to M3 are turned on, and the input terminal of an integrator Amp is set at a ground (GND) potential. Accordingly, the D electrodes of all photoelectric converting elements S11 to S33 are set at the GND potential. Almost simultaneously, the refresh controller RF outputs a Hi-level signal to turn on the switch SWg, so the potential of the G electrodes of all photoelectric converting elements S11 to S33 is rendered positive by the refresh power supply Vg. Accordingly, the operation of the photoelectric converting elements is switched to refreshing.

Next, the refresh controller RF outputs a Lo-level signal to turn off the switch SWg and turn on the switch SWs. Consequently, the potential of the G electrodes of all photoelectric converting elements S11 to S33 is rendered negative by the read power supply Vs, so the operation of the photoelectric converting elements is switched to photoelectric conversion. At the same time, the capacitors C11 to C33 are initialized. In this state, the shift registers SR1 and SR2 apply Lo-level signals to the control lines g1 to g3 and s1 to s3 to turn off the transfer TFTs T11 to T33 and the switches M1 to M3, respectively. Accordingly, the D electrodes of all photoelectric converting elements S11 to S33 are open, and electric charge generated by the photoelectric converting elements is stored in the capacitors C11 to C33.

When irradiation is performed during this photoelectric conversion, light (to be referred to as "image information light" hereinafter) having the information of a radiation image of the object 12 and having converted by the phosphor 20 enters the photoelectric converting elements. A photocurrent generated by this image information light stores the electric charge in the capacitors C11 to C33. The stored electric charge is held even after the irradiation is complete.

In an image data output operation, the shift register SR1 applies a Hi-level signal to the control line g1, and the shift register SR2 sequentially applies a Hi-level signal to the control lines s1 to s3. Consequently, the voltages charged to the capacitors C11 to C13 are sequentially input to the integrator Amp through the transfer TFTs T11 to T13 and the switches M1 to M3. Analogously, the voltages charged to the other capacitors C21 to C33 are sequentially input to the integrator Amp under the control of the shift registers SR1 and SR2.

After irradiation is performed during photoelectric conversion as described above, the radiation image sensing unit 22 outputs a signal corresponding to the radiation transmitted through the object 12. On the other hand, if no irradiation is performed, the radiation image sensing unit 22 outputs a signal corresponding to a dark current flowing through the photoelectric converting elements during photoelectric conversion. In this embodiment, an operation of discarding this signal corresponding to the dark current without reading it will be called "dummy read". The dark current in the photoelectric converting elements S11 to S33 constructing the radiation image sensing unit 22 used in this embodiment exponentially reduces as a function of the time from refreshing. Therefore, dummy read is performed to discharge electric charge stored before the dark current stabilizes after refreshing, i.e., electric charge charged to the capacitors by the dark current.

Image Sensing Procedure

Figure 4:
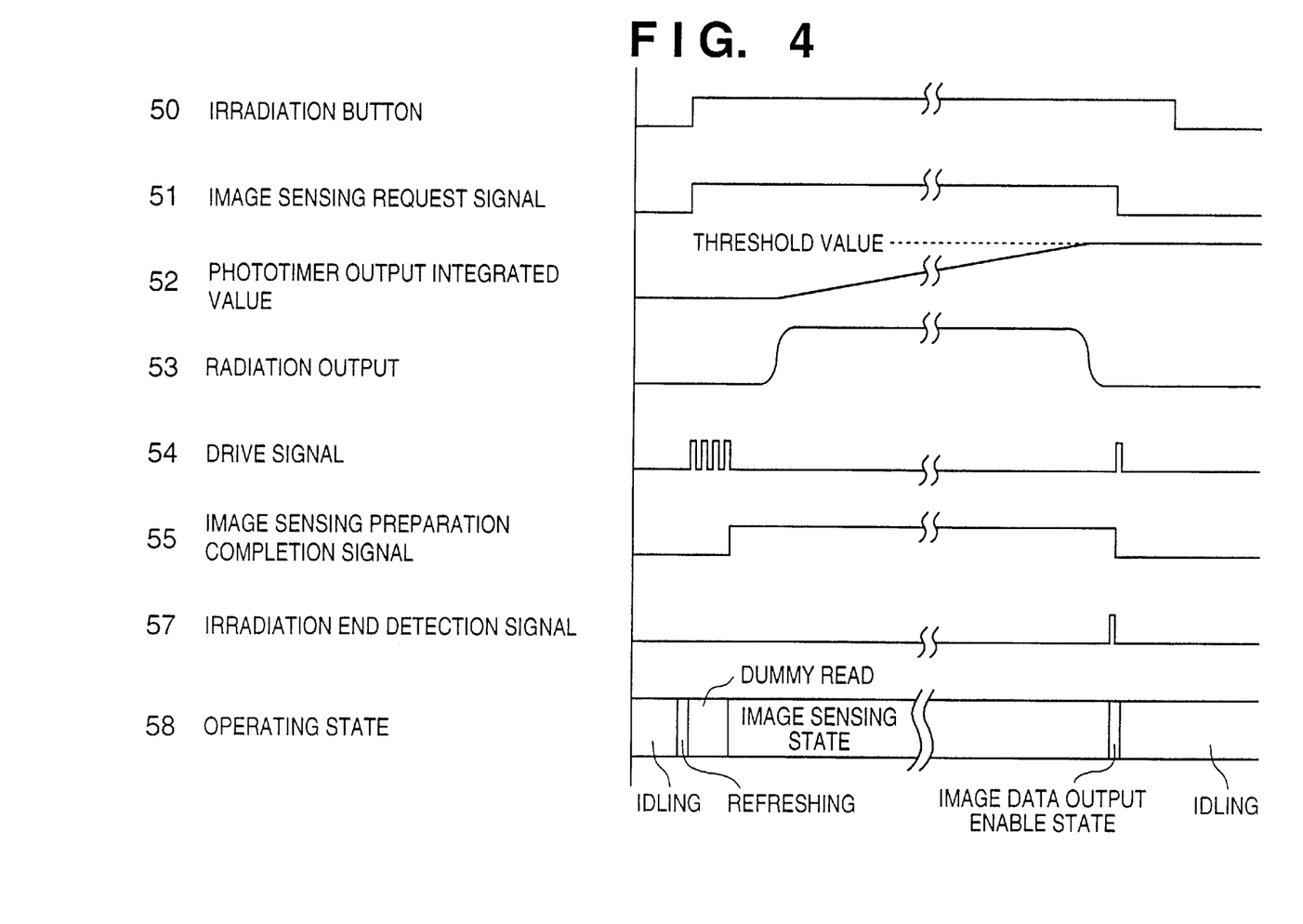
FIG. 4 is a timing chart for explaining an image sensing procedure in the first and third embodiments.
Figure 9:
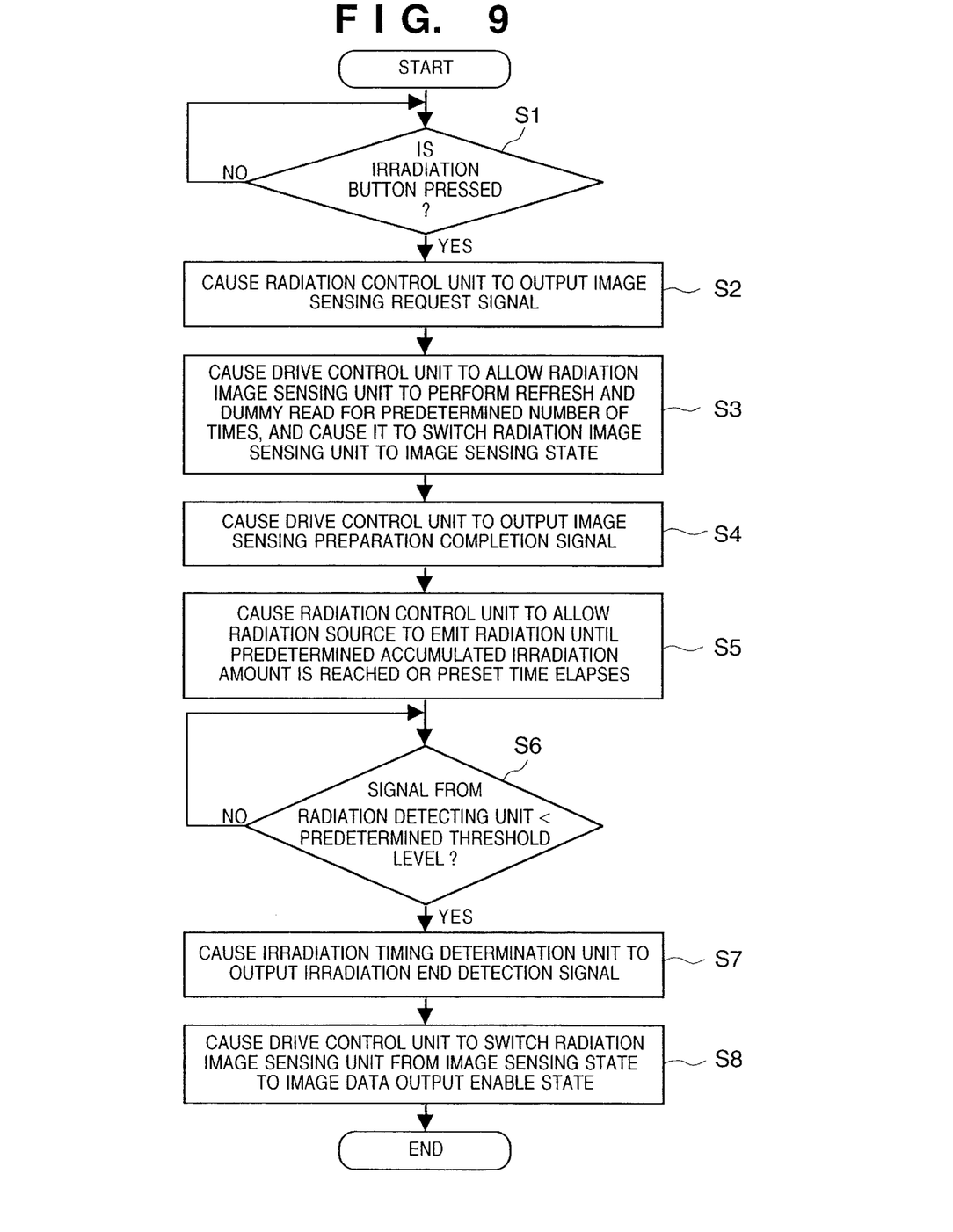
FIG. 9 is a flow chart showing the image sensing procedure in the first and third embodiments.

An image sensing procedure will be described below with reference to a timing chart shown in FIG. 4 and a flow chart shown in FIG. 9. In FIG. 4, reference numeral 54 denotes a signal that the drive control unit 25 uses to drive the refresh controller RF; and 58, the operating state of the radiation image sensing unit 22. Note that "idling" in the operation state 58 shown in FIG. 4 is a state after irradiation and image data output are complete and before refreshing is periodically performed to avoid the state shown in FIG. 3C caused by the dark current flowing through the photoelectric converting elements. An "image sensing preparation state", not-shown, is a state in which refreshing and dummy read described above are performed and before irradiation is started. An "image sensing state" is a state in which photoelectric conversion including irradiation described above is being performed. An "image data output enable state" is the photoelectric conversion state and the image data output operation state after irradiation is complete.

An operator of the apparatus observes the object 12 and instructs the object 12 to move. When the operator determines that the state of the object 12 is suited to image sensing, he or she presses an irradiation button 14 shown in FIG. 1 (step S1). Upon detecting a signal (50 in FIG. 4) from the irradiation button 14, the radiation control unit 13 transmits an image sensing request signal 51 to the drive control unit 25 through the synchronizing signal line (step S2). When receiving the image sensing request signal 51, the drive control unit 25 causes the radiation image sensing unit 22 to perform refreshing and dummy read for a predetermined number of times, and switches the radiation image sensing unit 22 to the image sensing state (step S3). After that, the drive control unit 25 transmits an image sensing preparation completion signal 55 to the radiation control unit 13 through the synchronizing signal line (step S4). The radiation control unit 13 receives the image sensing preparation completion signal 55 from the drive control unit 25 and causes the radiation source 10 to emit the radiation 11 (step S5). In FIG. 4, reference numeral 53 denotes the output state of the radiation 11 emitted from the radiation source 10. When the integrated level of outputs from a phototimer 15 shown in FIG. 1 reaches a threshold level (predetermined accumulated irradiation amount) or an irradiation time preset in the radiation control unit 13 has elapsed, the radiation control unit 13 terminates the irradiation of the radiation 11.

During the irradiation, a radiation detecting unit 23 monitors the radiation 11 and outputs a signal corresponding to the irradiation amount to an irradiation timing determination unit 24 in real time. It is desirable to place a plurality of such radiation detecting units 23 within the irradiation area of the radiation 11, since the irradiation area of the radiation 11 is limited in accordance with an image-sensed portion of the object 12, the posture of the object 12 during image sensing, and the like. The radiation detecting unit 23 can be obtained by arranging pixels for detection on the radiation image sensing unit 22 or can also be a sensor different from the radiation image sensing unit 22. Referring to FIG. 1, the phototimer 15 and the radiation detecting unit 23 are placed before and after the radiation image sensing unit 22. However, the positional relationship is not restricted to the one shown in FIG. †1, and the phototimer 15 is not always a necessary component.

When the signal from the radiation detecting unit 23 becomes smaller than a predetermined threshold level (step S6), the irradiation timing determination unit 24 determines that the irradiation of the radiation 11 is complete, and outputs an irradiation end detection signal 57 to the drive control unit 25 (step S7). Upon receiving the irradiation end detection signal 57, the drive control unit 25 switches the radiation image sensing unit 22 from the image sensing state to the image data output enable state (step S8). The image data output enable state is set because the image data is not necessarily output immediately after the irradiation is complete. However, since the S/N ratio of output image degrades due to storage of electric charge by a dark current, the image data is desirably output immediately after the completion of the irradiation.

The output signal from the radiation image sensing unit 22 is converted into digital data by the A/D converter 26 and output. The output digital data is stored in a storage device such as a hard disk (not shown) and displayed as an image or picture on a display device such as a CRT or an LCD (neither is shown).

Note that each control unit shown in FIG. 1 can be constructed by combining logical circuits or by using a microcomputer and a control program.

Second Embodiment

The second embodiment of the present invention will be described in detail below with reference to the accompanying drawings.

Figure 5:
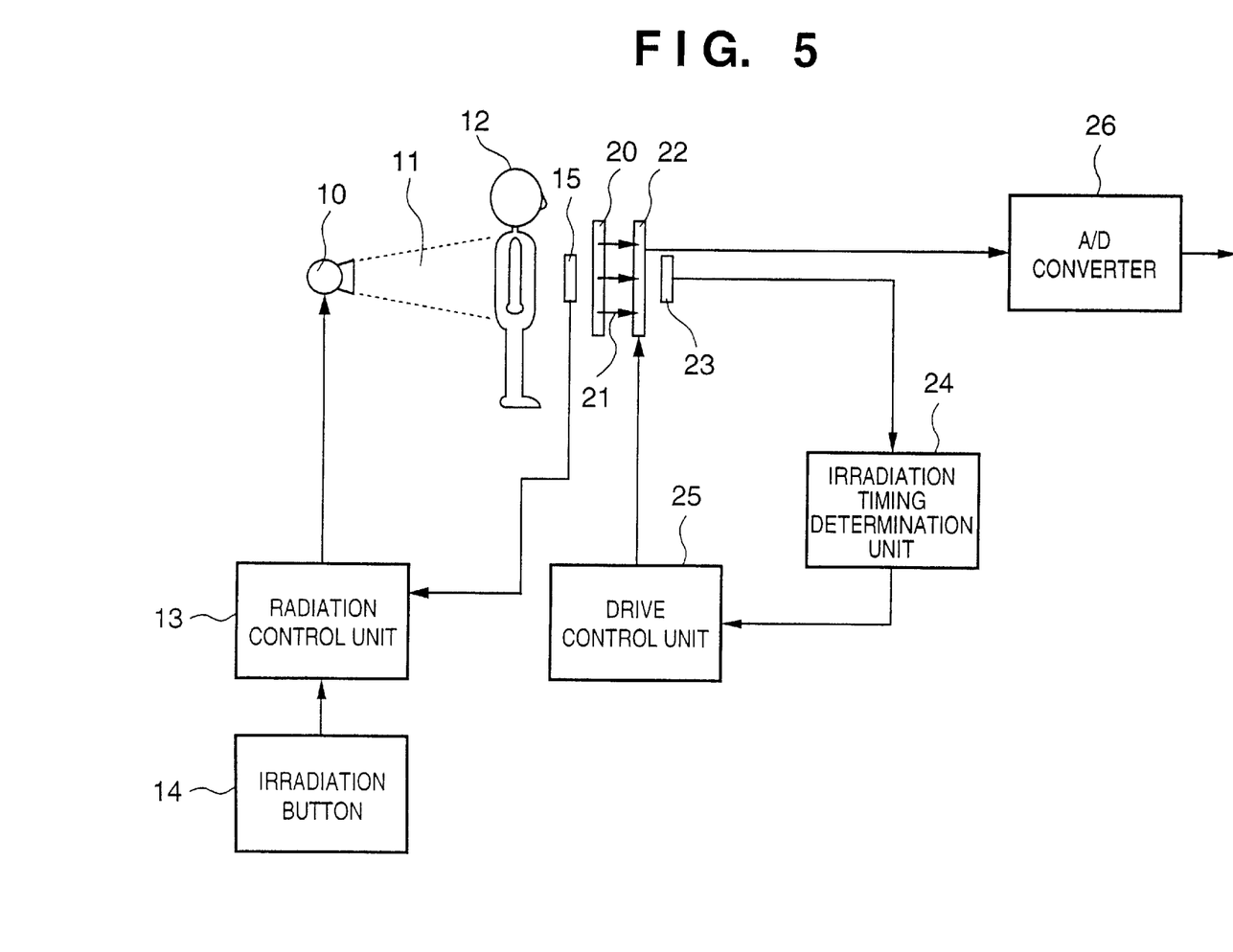
FIG. 5 is a block diagram showing an outline of the arrangement of a radiation image sensing apparatus according to the second embodiment of the present invention.

FIG. 5 is a block diagram showing an outline of the arrangement of a radiation image sensing apparatus according to the second embodiment of the present invention. The difference from the arrangement of the first embodiment shown in FIG. 1 is that a radiation control unit 13 and a drive control unit 25 are not connected by a synchronizing signal line.

Figure 6:
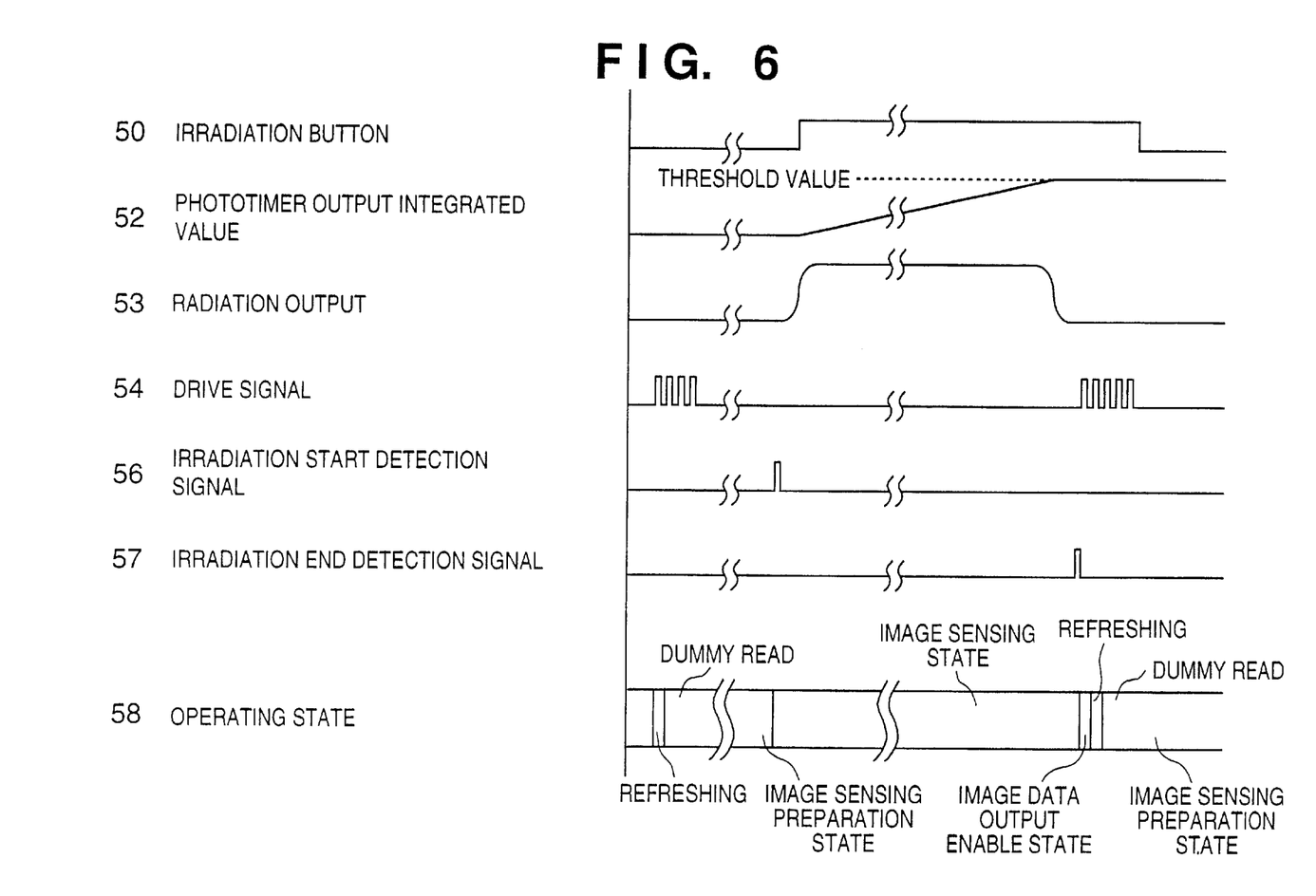
FIG. 6 is a timing chart for explaining an image sensing procedure in the second and fourth embodiments.
Figure 10:
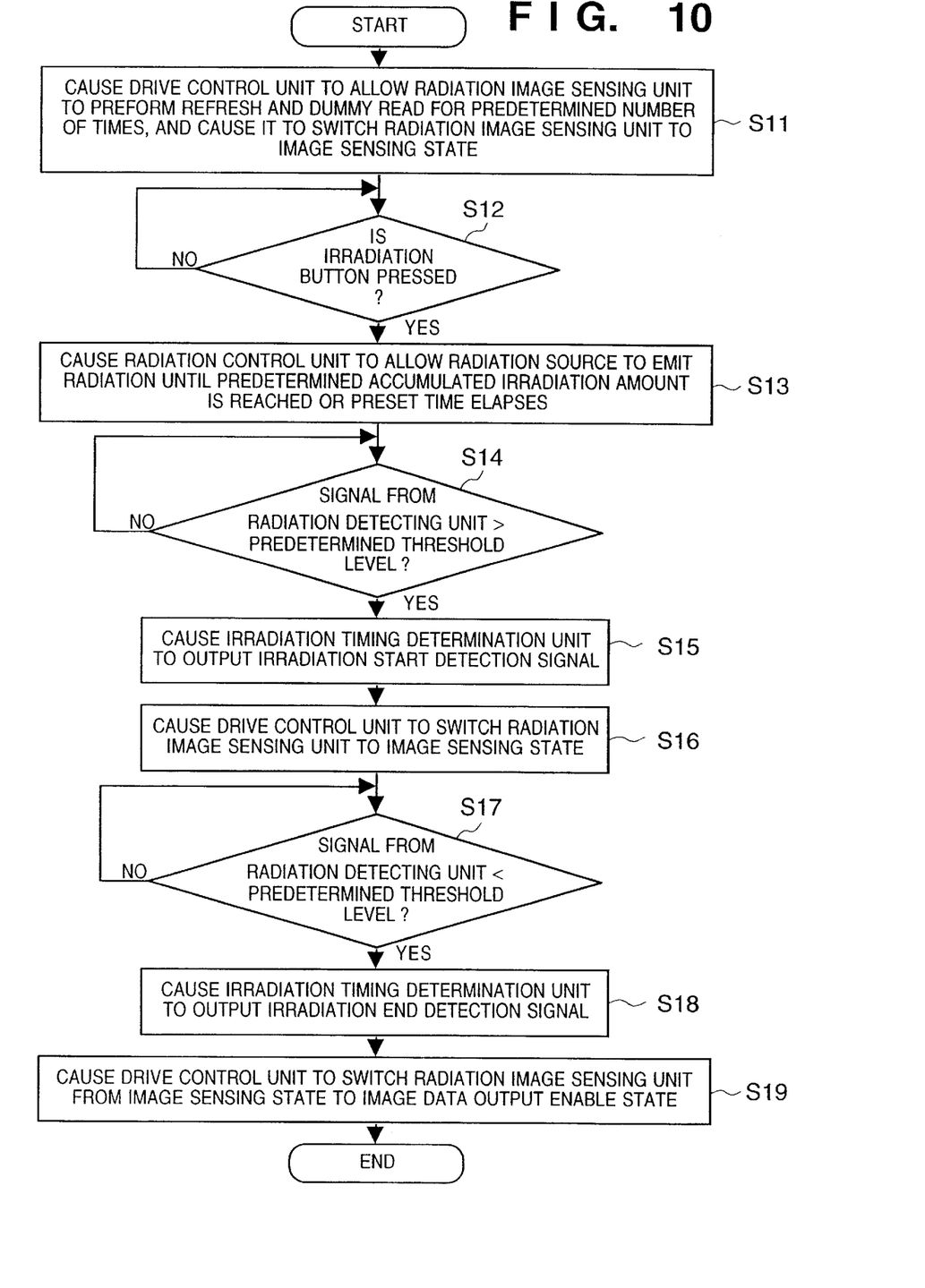
FIG. 10 is a flow chart showing the image sensing procedure in the second and fourth embodiments.

An image sensing procedure will be described below with reference to a timing chart shown in FIG. 6 and a flow chart shown in FIG. 10. When the power supply of the apparatus is turned on when image data has output after last image sensing, the drive control unit 25 causes a radiation image sensing unit 22 to perform refreshing and dummy read for a predetermined number of times. After that, the drive control unit 25 keeps a dark current flowing through the photoelectric converting elements and switches the mode to an image sensing preparation state for irradiation (step S11).

An operator of the apparatus observes an object 12 and instructs the object 12 to move. When the operator determines that the state of the object 12 is suited to image sensing, he or she presses an irradiation button 14 shown in FIG. 1 (step S12). Upon detecting a signal 50 from the irradiation button 14, the radiation control unit 13 causes a radiation source 10 to emit radiation 11 (step S13). A radiation detecting unit 23 monitors the radiation 11 and outputs a signal corresponding to the irradiation amount to an irradiation timing determination unit 24 in real time. When the signal from the radiation detecting unit 23 exceeds a predetermined threshold level (step S14), the irradiation timing determination unit 24 determines that the irradiation of the radiation 11 is started, and outputs an irradiation start detection signal 56 to the drive control unit 25 (step S15). Upon receiving the irradiation start detection signal 56, the drive control unit 25 switches the radiation image sensing unit 22 from the image sensing preparation state to an image sensing state (step S16).

When the integrated level of outputs from a phototimer 15 reaches a threshold level (predetermined accumulated irradiation amount) or an irradiation time preset in the radiation control unit 13 has elapsed, the radiation control unit 13 terminates the irradiation of the radiation 11. When the signal from the radiation detecting unit 23 becomes smaller than a predetermined threshold level (step S17), the irradiation timing determination unit 24 determines that the irradiation of the radiation 11 is complete, and outputs an irradiation end detection signal 57 to the drive control unit 25 (step S18). Upon receiving the irradiation end detection signal 57, the drive control unit 25 switches the radiation image sensing unit 22 from the image sensing state to an image data output enable state (step S19).

Note that the first and second threshold levels as criteria by which the irradiation timing determination unit 24 outputs the irradiation start detection signal and the irradiation end detection signal, respectively, can be equal to each other. However, these two values can also be made to have a difference by taking account of, e.g., noise contained in the output from the radiation detecting unit 23. The rest of the constituent requirements and functions are the same as in the first embodiment.

Third Embodiment

The third embodiment of the present invention will be described in detail below with reference to the accompanying drawings.

Figure 7:
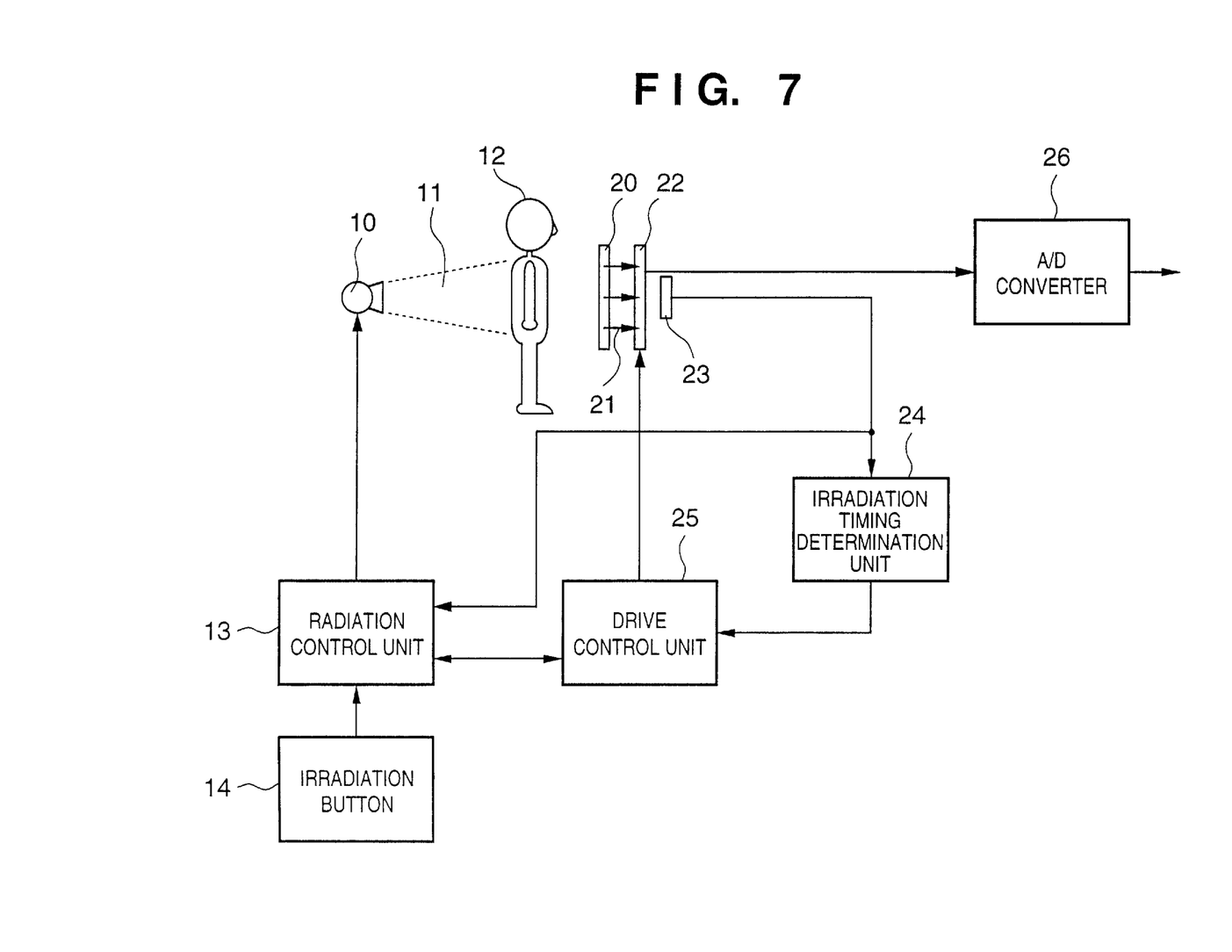
FIG. 7 is a block diagram showing an outline of the arrangement of a radiation image sensing apparatus according to the third embodiment of the present invention.

FIG. 7 is a block diagram showing an outline of the arrangement of a radiation image sensing apparatus according to the third embodiment of the present invention. The difference from the arrangement of the first embodiment shown in FIG. †1 is that a radiation detecting unit 23 also functions as a phototimer 15, so no phototimer 15 is necessary.

An image sensing procedure will be described below with reference to the timing chart in FIG. 4 and the flow chart in FIG. 9 as in the first embodiment. An operator of the apparatus observes an object 12 and instructs the object 12 to move. When the operator determines that the state of the object 12 is suited to image sensing, he or she presses an irradiation button 14 (step S1). Upon detecting a signal 50 from the irradiation button 14, a radiation control unit 13 transmits an image sensing request signal 51 to a drive control unit 25 through a synchronizing signal line (step S2). When receiving the image sensing request signal 51, the drive control unit 25 causes a radiation image sensing unit 22 to perform refreshing and dummy read for a predetermined number of times, and switches the radiation image sensing unit 22 to an image sensing state (step S3). After that, the drive control unit 25 transmits an image sensing preparation completion signal 55 to the radiation control unit 13 through the synchronizing signal line (step S4).

The radiation control unit 13 receives the image sensing preparation completion signal 55 from the drive control unit 25 and causes a radiation source 10 to emit radiation 11 (step S5). In FIG. †4, reference numeral 53 denotes the output state of the radiation 11 emitted from the radiation source 10. The radiation detecting unit 23 monitors the radiation 11 and outputs a signal corresponding to the irradiation amount to the radiation control unit 13 and an irradiation timing determination unit 24 in real time. When the integrated level of outputs from the radiation detecting unit 23 reaches a threshold level (predetermined accumulated irradiation amount) or an irradiation time preset in the radiation control unit 13 has elapsed, the radiation control unit 13 terminates the irradiation of the radiation 11. When the signal from the radiation detecting unit 23 becomes smaller than a predetermined threshold level (step S6), the irradiation timing determination unit 24 determines that the irradiation of the radiation 11 is complete, and outputs an irradiation end detection signal 57 to the drive control unit 25 (step S7).

Upon receiving the irradiation end detection signal 57, the drive control unit 25 switches the radiation image sensing unit 22 from the image sensing state to an image data output enable state (step S8).

The rest of the constituent requirements and functions are the same as in the first embodiment.

Fourth Embodiment

The fourth embodiment of the present invention will be described in detail below with reference to the accompanying drawings.

Figure 8:
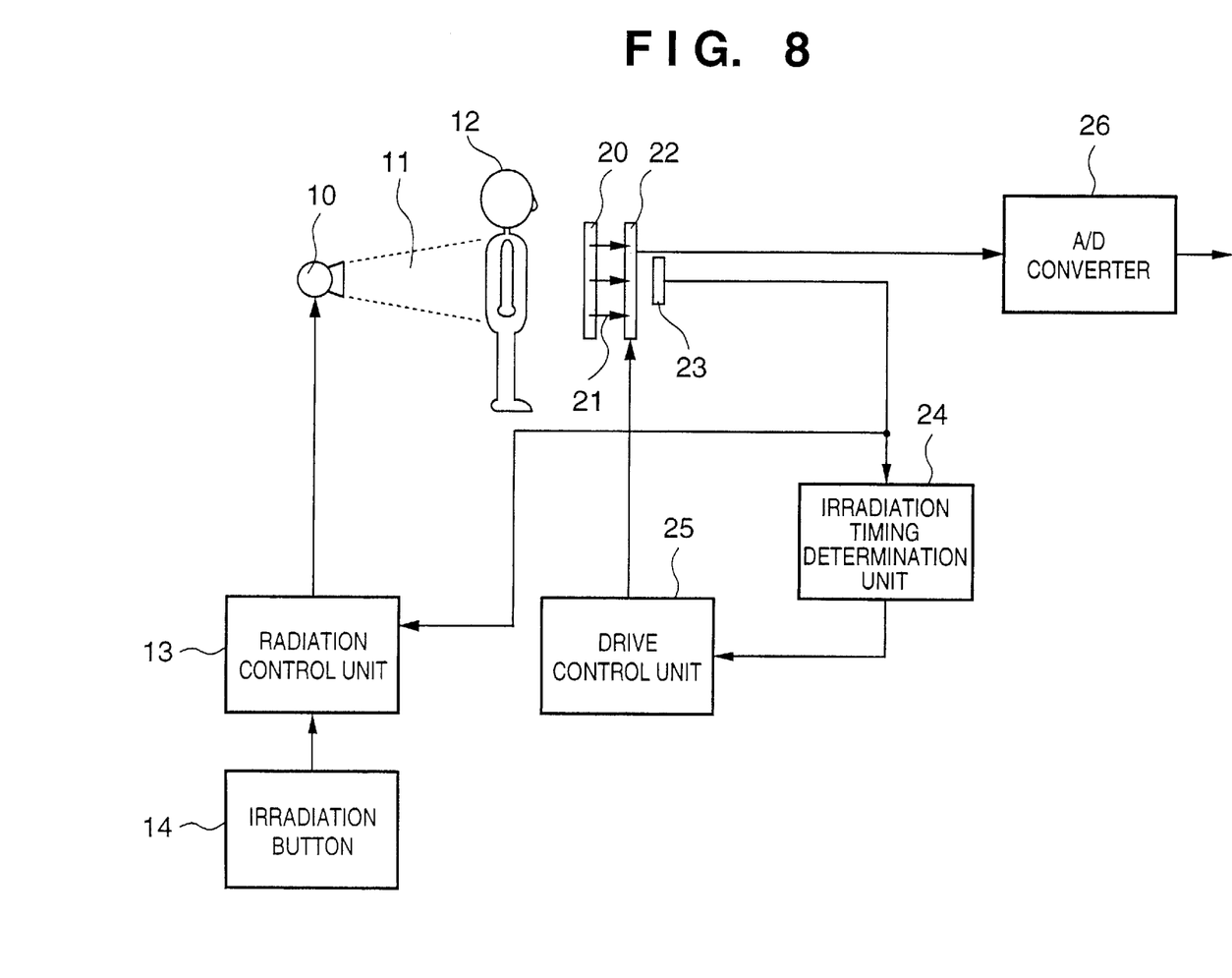
FIG. 8 is a block diagram showing an outline of the arrangement of a radiation image sensing apparatus according to the fourth embodiment of the present invention.

FIG. 8 is a block diagram showing an outline of the arrangement of a radiation image sensing apparatus according to the fourth embodiment of the present invention. The arrangement of the fourth embodiment is the same as the second embodiment in that there is no synchronizing signal line between a radiation control unit 13 and a drive control unit 25 and the same as the third embodiment in that a radiation detecting unit 23 also functions as a phototimer 15.

An image sensing procedure will be described below with reference to the timing chart in FIG. †6 and the flow chart in FIG. 10, as in the second embodiment. When the power supply of the apparatus has turned on or when image data is output after last image sensing, the drive control unit 25 causes a radiation image sensing unit 22 to perform refreshing and dummy read for a predetermined number of times. After that, the drive control unit 25 keeps flowing a dark current through photoelectric convening elements and switches to an image sensing preparation state for irradiation (step S11).

An operator of the apparatus observes an object 12 and instructs the object 12 to move. When the operator determines that the state of the object 12 is suited to image sensing, he or she presses an irradiation button 14 shown in FIG. 1 (step S12). Upon detecting a signal 50 from the irradiation button 14, the radiation control unit 13 causes a radiation source 10 to emit radiation 11 (step S13). The radiation detecting unit 23 monitors the radiation 11 and outputs a signal corresponding to the irradiation amount to the radiation control unit 13 and an irradiation timing determination unit 24 in real time. When the signal from the radiation detecting unit 23 exceeds a predetermined threshold level (step S14), the irradiation timing determination unit 24 determines that the irradiation of the radiation 11 is started, and outputs an irradiation start detection signal 56 to the drive control unit 25 (step S15). Upon receiving the irradiation start detection signal 56, the drive control unit 25 switches the radiation image sensing unit 22 from the image sensing preparation state to an image sensing state (step S16).

When the integrated level of outputs from the radiation detecting unit 23 reaches a threshold level (predetermined accumulated irradiation amount) or an irradiation time preset in the radiation control unit 13 has elapsed, the radiation control unit 13 terminates the irradiation of the radiation 11. When the signal from the radiation detecting unit 23 becomes smaller than a predetermined threshold level (step S17), the irradiation timing determination unit 24 determines that the irradiation of the radiation 11 is complete, and outputs an irradiation end detection signal 57 to the drive control unit 25 (step S18). Upon receiving the irradiation end detection signal 57, the drive control unit 25 switches the radiation image sensing unit 22 from the image sensing state to an image data output enable state (step S19).

The rest of the constituent requirements and functions are the same as in the second embodiment.

In each of the embodiments as described above, the irradiation state of radiation is monitored, and the operating state of the radiation image sensing unit is set by checking the irradiation state or the irradiation start or end timing. This simplifies or obviates the connection between the radiation generator and the radiation image sensing apparatus and enables radiation image sensing synchronized with the irradiation timing. Also, a phototimer for detecting radiation can be omitted by imparting this function to the radiation detecting unit. This simplifies the system configuration of the radiation image sensing apparatus.

The present invention can be applied to a system constituted by a plurality of devices (e.g., host computer, interface, reader, printer) or to an apparatus comprising a single device.

Further, the object of the present invention can be also achieved by providing a storage medium storing program codes for performing the aforesaid processes to a system or an apparatus, reading the program codes with a computer (e.g., CPU, MPU) of the system or apparatus from the storage medium, then executing the program.

In this case, the program codes read from the storage medium realize the functions according to the embodiments, and the storage medium storing the program codes constitutes the invention.

Further, the storage medium, such as a floppy disk, a hard disk, an optical disk, a magneto-optical disk, CD-ROM, CD-R, a magnetic tape, a non-volatile type memory card, and ROM can be used for providing the program codes.

Furthermore, besides aforesaid functions according to the above embodiments are realized by executing the program codes which are read by a computer, the present invention includes a case where an OS (operating system) or the like working on the computer performs a part or entire processes in accordance with designations of the program codes and realizes functions according to the above embodiments.

Furthermore, the present invention also includes a case where, after the program codes read from the storage medium are written in a function expansion card which is inserted into the computer or in a memory provided in a function expansion unit which is connected to the computer, CPU or the like contained in the function expansion card or unit performs a part or entire process in accordance with designations of the program codes and realizes functions of the above embodiments.

What is claimed is:

1. A system for obtaining a radiation image of an object, comprising:

a radiation image-sensing unit which has a plurality of photoelectric converting elements;

a control unit which controls a state of said radiation image-sensing unit; and a detecting unit which detects irradiation of radiation, wherein first switching is defined as switching of the state from a preparation state in which preparation for image-sensing is performed, to an image-sensing state in which the image sensing is performed by storing image information in said radiation image-sensing unit, and second switching is defined as switching of the state from the image-sensing state to an output state in which an output of image data is enabled, wherein said control unit transmits a signal to a radiation control unit, in sync with the first switching, so that the radiation is emitted, and wherein said control unit performs the second switching based on an output of said detecting unit.

2. A system for obtaining a radiation image of an object, comprising:

a radiation image-sensing unit which has a plurality of photoelectric converting elements;

a control unit which controls a state of said radiation image-sensing unit; and a detecting unit which detects irradiation of radiation, wherein first switching is defined as switching of the state from a preparation state in which preparation for image sensing is performed, to an image-sensing state in which the image sensing is performed by storing image information in said radiation image-sensing unit, and second switching is defined as switching of the state from the image-sensing state to an output state in which an output of image data is enabled, and said control unit performs each of the first and second switching based on an output of said detecting unit.

3. A method adapted to a system that obtains a radiation image of an object by using a radiation image-sensing unit having a plurality of photoelectric converting elements, a control unit for controlling a state of the radiation image-sensing unit and a detecting unit for detecting irradiation of radiation, wherein first switching is defined as switching of the state from a preparation state in which preparation for image sensing is performed, to an image-sensing state in which the image sensing is performed by storing image information in the radiation image-sensing unit, and second switching being defined as switching of the state from the image-sensing state to an output state in which an output of an image data is enabled, the method comprising the steps of:

transmitting a signal from the control unit to a radiation control unit, in sync with the first switching by the control unit, so that the radiation is emitted; and performing the second switching by the control unit based on an output of the detecting unit.

4. A method adapted to a system that obtains a radiation image of an object by using a radiation image-sensing unit having a plurality of photoelectric converting elements, a control unit for controlling a state of the radiation image sensing unit and a detecting unit for detecting irradiation of radiation, wherein first switching is defined as switching of the state from a preparation state in which preparation for image sensing is performed, to an image-sensing state in which the image sensing is performed by storing image information in the radiation image-sensing unit, and second switching is defined as switching of the state from the image-sensing state to an output state in which an output of image data is enabled, the method comprising the steps of:

performing the first switching by the control unit based on an output of the detecting unit; and performing the second switching by the control unit based on an output of the detecting unit.

5. A computer-readable storage medium storing a program code for making a computer execute a method adapted to a system that obtains a radiation image of an object by using a radiation image-sensing unit having a plurality of photoelectric converting elements, a control unit for controlling a state of the radiation image-sensing unit and a detecting unit for detecting irradiation of radiation, wherein first switching is defined as switching of the state from a preparation state in which preparation for image sensing is performed, to an image-sensing state in which the image sensing is performed by storing image information in the radiation image-sensing unit, and second switching is defined as switching of the state from the image-sensing state to an output state in which an output of image data is enabled, the method comprising the steps of:

transmitting a signal from the control unit to a radiation control unit, in sync with the first switching by the control unit, so that the radiation is emitted; and performing the second switching by the control unit based on an output of the detecting unit.

6. A computer-readable storage medium storing a program code for making a computer execute a method adapted to a system that obtains a radiation image of an object by using a radiation image-sensing unit having a plurality of photoelectric converting elements, a control unit for controlling a state of the radiation image-sensing unit and a detecting unit for detecting irradiation of radiation, wherein first switching is defined as switching of the state from a preparation state in which preparation for image sensing is performed, to an image-sensing state in which the image sensing is performed by storing image information in the radiation image-sensing unit, and second switching is defined as switching of the state from the image-sensing state to an output state in which an output of image data is enabled, the method comprising the steps of:

performing the first switching by the control unit based on an output of the detecting unit; and performing the second switching by the control unit based on an output of the detecting unit.

* * * * *

UNITED STATES PATENT AND TRADEMARK OFFICE
CERTIFICATE OF CORRECTION

PATENT NO. : 6,643,411 B2  
DATED : November 4, 2003  
INVENTOR(S) : Hideki Nonaka It is certified that error appears in the above-identified patent and that said Letters Patent is hereby corrected as shown below:

Title page,  
Item [57], ABSTRACT, should read  
-- System for obtaining a radiation image of an object includes a radiation image sensing unit having a plurality of photoelectric conversion elements, a control unit for controlling a state of the radiation image sensing unit, and a detecting unit for detecting irradiation of radiation. The system is configured such that both a start and a an end of an image sensing state of the radiation image sensing unit is in sync with a start and an end of the irradiation, respectively, by use of the control unit and the detecting unit. --

Column 2,  
Line 18, "co" should read -- to --.

Column 6,  
Lines 2 and 4, "be also" should be -- also be --.

Column 12,  
Line 38, "be also" should read -- also be --.

Signed and Sealed this

Eighteenth Day of January, 2005

JON W. DUDAS  
*Director of the United States Patent and Trademark Office*